(12) United States Patent
Goto et al.

(10) Patent No.: US 8,418,650 B2
(45) Date of Patent: Apr. 16, 2013

(54) INNER ELECTRODE FOR BARRIER FILM FORMATION AND APPARATUS FOR FILM FORMATION

(75) Inventors: Seiji Goto, Aichi (JP); Hideo Yamakoshi, Kanagawa (JP); Atsushi Ueda, Tokyo (JP); Kenichi Okamoto, Tokyo (JP); Yuji Asahara, Kanagawa (JP); Minoru Danno, Kanagawa (JP)

(73) Assignee: Mitsubishi Heavy Industries Food & Packaging Machinery Co., Ltd., Aichi (JP)

( * ) Notice: Subject to any disclaimer, the term of this patent is extended or adjusted under 35 U.S.C. 154(b) by 0 days.

(21) Appl. No.: 13/229,393

(22) Filed: Sep. 9, 2011

(65) Prior Publication Data

US 2012/0000771 A1   Jan. 5, 2012

Related U.S. Application Data

(62) Division of application No. 11/660,201, filed as application No. PCT/JP2005/019029 on Oct. 17, 2005, now Pat. No. 8,034,177.

(30) Foreign Application Priority Data

Oct. 18, 2004   (JP) ................................. 2004-303033

(51) Int. Cl.
   *C23C 16/00*   (2006.01)
   *C23C 16/50*   (2006.01)
   *C23F 1/00*    (2006.01)
   *H01L 21/306*  (2006.01)

(52) U.S. Cl.
   USPC .............. 118/723 E; 156/345.43; 315/111.21

(58) Field of Classification Search ............ 118/715, 118/723, 728–733, 723 E; 156/345.5, 345.51–345.55, 345.43–345.47; 315/111.21

See application file for complete search history.

(56) References Cited

U.S. PATENT DOCUMENTS 3,558,973 A    1/1971   Pochert et al.
6,271,497 B1 *  8/2001   Zapletal ................... 219/121.36

(Continued)

FOREIGN PATENT DOCUMENTS

JP   56-146621 A   11/1981
JP   56-146622 A   11/1981

(Continued)

OTHER PUBLICATIONS

A. Krainev, Mekhanika machin, M. Mashinostroenie Publishers, 2000, p. 609 D2.

(Continued)

*Primary Examiner* — Maureen Gramaglia
*Assistant Examiner* — Tiffany Nuckols
(74) *Attorney, Agent, or Firm* — Birch, Stewart, Kolasch & Birch, LLP

(57) ABSTRACT

An inner electrode for barrier film formation is an inner electrode for barrier film formation that is inserted inside a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container, and that is provided with a gas supply pipe having a gas flow path to supply a medium gas and an insulating member screwed into an end portion of the gas supply pipe to be flush therewith and having a gas outlet communicated with the gas flow path.

12 Claims, 6 Drawing Sheets

U.S. PATENT DOCUMENTS

2003/0087030 A1    5/2003   Hama et al.
2004/0227197 A1   11/2004   Maekawa

FOREIGN PATENT DOCUMENTS

| | | |
|---|---|---|
| JP | 8-53116 A | 2/1996 |
| JP | 2788412 B2 | 6/1998 |
| JP | 2003-286571 A | 10/2003 |
| JP | 2003-293135 A | 10/2003 |
| JP | 2004-277882 A | 10/2004 |
| SU | 1565619 | 5/1990 |

OTHER PUBLICATIONS

English Machine Translation of JP2003-286571. Performed and printed May 5, 2010 from http://www4.ipdl.inpit.go.jp/.

* cited by examiner

BACKGROUND ART

INNER ELECTRODE FOR BARRIER FILM FORMATION AND APPARATUS FOR FILM FORMATION

This application is a Divisional of application Ser. No. 11/660,201, filed on Apr. 11, 2007 now U.S. Pat. No. 8,034, 177, and for which priority is claimed under 35 U.S.C. §120. Application Ser. No. 11/660,201 is the national phase of PCT International Application No. PCT/JP2005/19029 filed on Oct. 17, 2005 under 35 U.S.C. §371, which claims priority of Application No. 2004-303033 filed in Japan on Oct. 18, 2004, under 35 U.S.C. §119. The entire contents of all of the above patent applications are hereby incorporated by reference.

TECHNICAL FIELD

The present invention relates to an inner electrode for barrier film formation to form a barrier film that provides a gas barrier property to, for example, a container made of resin or the like, and the like and to an apparatus for film formation.

BACKGROUND ART

In recent years, coating an inner surface of, for example, pet (PET) bottle that is one of plastic containers with a hard carbon film such as DLC (diamond like carbon) has been tried to prevent oxygen from permeating from the outside and carbon dioxide from permeating from the inside (for example, carbonated drinks), and various apparatus for film formation therefor have been offered (see Patent Documents 1 to 3).

Here, as an apparatus for film formation to form a carbon film on a plastic container by making use of high frequency plasma CVD (chemical-vapor deposition) method, an explanation of the apparatus according to Patent Document 3 that is a basic invention to coat the inside of a container is given with reference to FIG. 9.

As shown in FIG. 9, the apparatus for film formation is an apparatus to carry out film formation by discharge plasma on the inner surface of a plastic container 12 having an opening 11, and the apparatus is provided with an outer electrode 13 composed of an outer upper electrode 13-1 and an outer lower electrode 13-2 that are large enough to enclose the outer periphery of the plastic container 12, an exhaust pipe 14 attached via an insulating member 26 to an end face of the outer electrode 13 on the side where the opening 11 is arranged, an inner electrode 17 that is inserted from the exhaust pipe 14 side into the inside of the plastic container 12 in the outer electrode 13 approximately over the full longitudinal length of the plastic container 12 and is connected to the ground side as well as pierced with a gas outlet 16 to blow-off a medium gas G, an exhauster that is not shown but attached to the exhaust pipe 14, a gas supply unit that is not shown but supplies the medium gas G to the inner electrode 17, and a high frequency power source 18 connected to the outer electrode 13.

Here, the outer electrode 13 is provided inside a cylindrical chamber 22 having flanges 21a and 21b at the upper and lower ends, respectively, and the cylindrical chamber 22 is placed and held on an annular base 23. A circular insulating plate 24 is arranged between the annular base 23 and the bottom back side of the outer lower electrode 13-2. A cylindrical insulating member 20 is provided at the end of the gas outlet 16 of the inner electrode 17, so that local plasma concentration is prevented.

A method of coating a bottle with a carbon film with the use of an apparatus in such a structure is explained.

First, the plastic container 12 is inserted inside the outer electrode 13, and inner gas is exhausted through the gas exhaust pipe 14. After having reached a predetermined vacuum (representative value: $10^{-1}$ to $10^{-5}$ Torr), the medium gas G is supplied to the inner electrode 17 at a flow rate of, for example, from 10 to 200 mL/min, and further blown off to the inside of the plastic container 12 through the gas outlet 16 of the inner electrode 17. Note that as this medium gas G, for example, benzene, toluene, xylene, aliphatic hydrocarbons such as cyclohexane, aromatic hydrocarbons, oxygen-containing hydrocarbons, or nitrogen-containing hydrocarbons are used. The pressure inside the plastic container 12 is set to, for example, from $2 \times 10^{-1}$ to $1 \times 10^{-2}$ Torr depending on the balance between a volume of gas supply and a volume of exhaust. Then, high frequency power of from 50 to 2000 W is applied from the high frequency power source 18 through an impedance matching unit 36 and a RF (radio frequency) input terminal 35 to the outer electrode 13.

By the application of high frequency power to the outer electrode 13 in this way, plasma is generated between the outer electrode 13 and the inner electrode 17. At this time, since the plastic container 12 is housed inside the outer electrode 13 with almost no space, plasma is generated inside the plastic container 12. The medium gas G is dissociated by the plasma or further ionized to generate film forming species to form a carbon film. The film forming species deposit on the inner surface of the container 12 to form a carbon film. After the carbon film is formed to have a predetermined film thickness, the application of high frequency power is stopped, the medium gas supply is stopped, the residual gas is exhausted, nitrogen, rare gas, air, or the like is supplied inside the outer electrode 13, and the pressure in this space is returned to atmospheric pressure. After this, the plastic container 12 is removed from the outer electrode 13. In this method, it takes two to three seconds to form a carbon film having a thickness of 20 to 30 nm.

Patent Document 1: Patent Application Laid-Open No. H8-53116

Patent Document 2: Japanese Patent No. 2788412

Patent Document 3: Patent Application Laid-Open No. 2003-286571

DISCLOSURE OF INVENTION

Problem to be Solved by the Invention

However, in the apparatus for film formation, there are sometimes cases where an insulating member is broken or falls off due to thermal stress caused by the difference of its coefficient of thermal expansion during film formation for a long time because the insulating member 20 provided at the gas outlet 16 of the inner electrode is cylindrical.

When it falls off, the insulating function is destroyed, resulting in generation of plasma concentration. This requires a temporal halt of the production system in a case of continuous production of, for example, plastic container, resulting in a cause of reduction in production efficiency.

Taking the problems into consideration, objects of the present invention are to provide an inner electrode for barrier film formation and an apparatus for film formation that can prevent an insulating member of the inner electrode in an apparatus for film formation from falling off and stably carry out film formation of a barrier film for a container at all times.

Means for Solving Problem

In order to solve the problems and to achieve an object, a first aspect of the present invention is an inner electrode for barrier film formation that is inserted inside a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container. The inner electrode for barrier film formation includes a gas supply pipe having a gas flow path to supply the medium gas; and an insulating member screwed into an end portion of the gas supply pipe to be flush therewith and having a gas outlet communicated with the gas flow path.

In the inner electrode for barrier film of a second aspect according to the first aspect, a plasma generation portion having at least one protruding portion or indentation is integrally provided to the gas supply pipe.

In the inner electrode for barrier film of a third aspect according to the second aspect, the plasma generation portion is made of a material with high thermal conductivity.

A fourth aspect of the present invention is an inner electrode for barrier film formation that is inserted inside a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container. The inner electrode for barrier film formation includes a gas supply pipe having a gas flow path to supply the medium gas; and an insulating member integrally provided inside a concave portion formed in an end portion of the gas supply pipe via an adhesive and having a gas outlet communicated with the gas flow path.

In the inner electrode for barrier film of a fifth aspect according to the fourth aspect, the end of the concave portion is crimped.

In the inner electrode for barrier film of a sixth aspect according to the fourth aspect, a plasma generation portion having at least one protruding portion or indentation is integrally provided to the gas supply pipe.

In the inner electrode for barrier film of a seventh aspect according to the sixth aspect, the plasma generation portion is made of a material with high thermal conductivity.

An eighth aspect of the present invention is an inner electrode for barrier film formation that is inserted inside a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container. The inner electrode for barrier film formation includes a gas supply pipe having a gas flow path to supply the medium gas; and an insulating member having a bulging portion fit inside a concave portion formed in an end portion of the gas supply pipe and having a gas outlet communicated with the gas flow path.

In the inner electrode for barrier film of a ninth aspect according to the eighth aspect, the end of the concave portion is crimped.

In the inner electrode for barrier film of a tenth aspect according to the eighth aspect, a plasma generation portion having at least one protruding portion or indentation is integrally provided to the gas supply pipe.

In the inner electrode for barrier film of an eleventh aspect according to the tenth aspect, the plasma generation portion is made of a material with high thermal conductivity.

A twelfth aspect of the present invention is an inner electrode for barrier film formation that is inserted inside a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container. The inner electrode for barrier film formation includes a gas supply pipe having a gas flow path to supply the medium gas and an end portion thereof being a convex portion; a cap member screwed onto the convex portion such that the side faces become flush with each other, having an opening in the center portion of an end face, and being hollow inside; and an insulating member not only engaged with a step portion of the opening of the cap member but also screwed on an inner surface of the cap member, and having a gas outlet communicated with the gas flow path.

In the inner electrode for barrier film of a thirteenth aspect according to the twelfth aspect, a plasma generation portion having at least one protruding portion or indentation is integrally provided to the gas supply pipe.

In the inner electrode for barrier film of a fourteenth aspect according to the thirteenth aspect, the plasma generation portion is made of a material with high thermal conductivity.

A fifteenth aspect of the present invention is an inner electrode for barrier film formation that is inserted inside a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container. The inner electrode for barrier film formation includes a gas supply pipe having a gas flow path to supply the medium gas and an end portion thereof provided with a concave portion having a long space in the axial direction; an insulating member screwed on an inner surface of the concave portion of the gas supply pipe and having a gas outlet communicated with the gas flow path; and a solid cap member screwed, in a screw portion, into the concave portion such that the side faces become flush with each other, formed with a hole over the axial direction, and fit with the outer periphery of the gas outlet of the insulating member.

In the inner electrode for barrier film of a sixteenth aspect according to the fifteenth aspect, a plasma generation portion having at least one protruding portion or indentation is integrally provided to the gas supply pipe.

In the inner electrode for barrier film of a seventeenth aspect according to the sixteenth aspect, the plasma generation portion is made of a material with high thermal conductivity.

An eighteenth aspect of the present invention is an inner electrode for barrier film formation that is inserted inside a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container. The inner electrode for barrier film formation includes a plasma generation portion having at least one protruding portion or indentation and integrally provided to the inner electrode.

In the inner electrode for barrier film of a nineteenth aspect according to the eighteenth aspect, a plasma generation portion having at least one protruding portion or indentation is integrally provided to the gas supply pipe.

In the inner electrode for barrier film of a twentieth aspect according to the nineteenth aspect, the plasma generation portion is made of a material with high thermal conductivity.

In the inner electrode for barrier film of a twenty-first aspect according to any one of the first, twelfth, and fifteenth aspect, a seal member to seal the screw portion is provided.

In the inner electrode for barrier film of a twenty-second aspect according to any one of the first, fourth, eighth, twelfth, fifteenth, and eighteenth aspect, the gas supply pipe is made of metal.

A twenty-third aspect of the present invention is an apparatus for film formation comprising the inner electrodes for barrier film formation of any one of the first, fourth, eighth, twelfth, fifteenth, and eighteenth aspect, and carrying out film formation of a barrier film on the inner surface of a plastic container.

A twenty-fourth aspect of the present invention is an apparatus for film formation to apply a barrier film on the inner surface of a plastic container having an opening by discharge plasma. The apparatus for film formation includes an outer electrode having a size large enough to enclose the outer periphery of the plastic container; an exhaust pipe attached via an insulating member to an end face of the outer electrode on the side where the opening is arranged; the inner electrodes for barrier film formation of any one of the first, fourth, eighth, twelfth, fifteenth, and eighteenth aspect that is inserted approximately over the full longitudinal length of the plastic container from the exhaust pipe side into the plastic container inside the outer electrode and connected to the ground side; an exhauster attached to the exhaust pipe; a gas supplying unit that supplies a medium gas to the inner electrode; and a high frequency power source connected to the outer electrode.

EFFECT OF THE INVENTION

According to the present invention, when film formation of a barrier film is carried out on an inner surface of a plastic container or the like, film formation can be stably carried out for a long time. Owing to this, it is possible to carry out film formation of a gas barrier film on an inner surface of a plastic container while retaining the quality of film formation for a long time.

Figure 1:
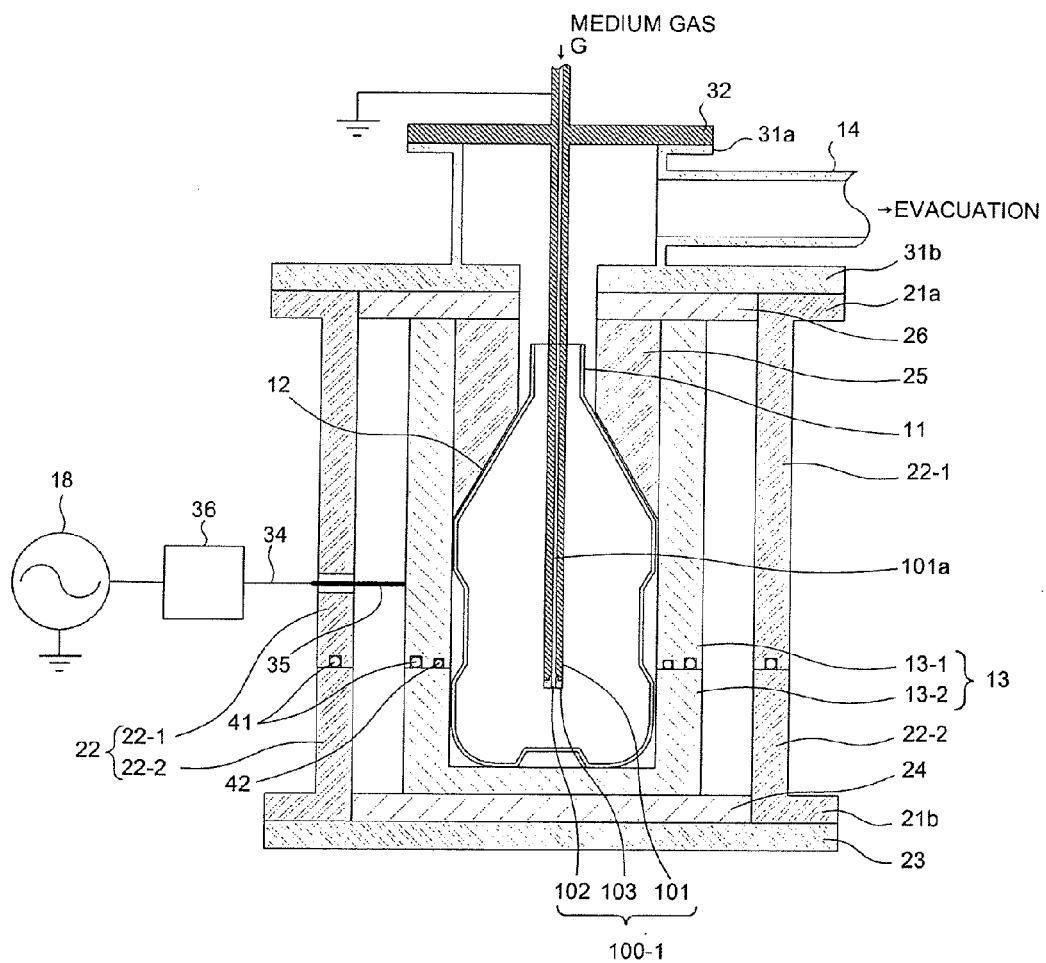
FIG. 1 is a schematic diagram of an apparatus for film formation according to a first embodiment.

EXPLANATIONS OF LETTERS OR NUMERALS 100-1 to 100-7 Inner electrode
101 Gas supply pipe
102 Gas outlet
103 Insulating member
104 Male portion
105 Adhesive
106 Cap member
120 Seal portion
131 Plasma generation portion
11 Opening
12 Plastic container
13 Outer electrode
14 Exhaust pipe
16 Gas outlet
17 Inner electrode
18 High frequency power source
G Medium gas

Best Mode(S) For Carrying out the Invention

Hereinafter, the present invention is explained in detail with reference to the accompanying drawings. Note that the present invention is not limited to these embodiments. Further, the components in the following embodiments include ones that those skilled in the art can easily conceive, or that are essentially the same.

First Embodiment

Figure 2:
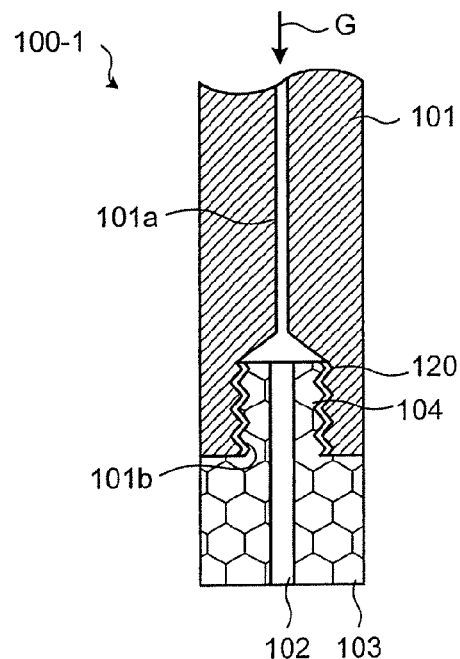
FIG. 2 is a schematic diagram of an inner electrode for barrier film formation according to the first embodiment.

A schematic inner electrode for barrier film formation according to a first embodiment of the present invention is shown in FIG. 2. As shown in FIG. 2, an inner electrode for barrier film formation 100-1 according to the present embodiment is an inner electrode for barrier film formation that is inserted inside a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container, and that is provided with a gas supply pipe 101 having a gas flow path 101a to supply a medium gas G and an insulating member 103 screwed to be flush with an end portion of the gas supply pipe 101 and having a gas outlet 102 communicated with the gas flow path 101a.

Since the gas outlet 102 is made of an insulating material, it is possible to prevent local plasma concentration.

Here, as a material for the insulating member 103, materials having thermal resistance such as fluororesins, PEEK, and polyimide, and materials having high thermal conductivity and high thermal and impact resistance such as alumina, zirconia, titania, and silica can be listed.

Further, there is no protruding portion in the entire form of the inner electrode, and therefore, it is possible to prevent local plasma concentration.

The gas supply pipe 101 is made of metal, and a structure to increase the air tightness can be achieved by forming not only a female portion 101b inside the metal gas supply pipe 101 but also a male portion 104 on the insulating member 103 to be screwed together for connection. In addition, the air tightness can be further increased by providing a seal portion 120 to the screw portion.

Here, as a material for the seal portion 120, for example, tape made of Teflon (trademark) can be exemplified.

Furthermore, even when thermal expansion is repeated, the tightness of screw may be retained by making the female portion 101b constituting the screw portion into an unfolded fan-shape such that the edge is gradually widened toward the end and by making the screwed male portion 104 into a taper shape in cross section.

Owing to this, a stable barrier film can be formed on the inner surface of a plastic container even if operated for a long time.

Thus, the durability of inner electrode parts is enhanced and their ease of maintenance is improved.

Here, as the container, for example, plastic containers for food containers and pharmaceutical containers can be listed, and the barrier film is effective for film and the like as a gas barrier film besides containers. Moreover, it can be applied to containers to be filled with fuel such as gasoline tank.

Here, as the plastic, well-known materials, for example, polyester film such as polyethylene terephthalate, polyolefin film such as polyethylene, polypropylene, and polybutene, polystyrene film, polyamide film, polycarbonate film, and polyacrylonitrile film can be exemplified.

Here, in the present invention, the gas barrier film indicates a film that is formed on the surface of a base material and has gas impermeability. As a gas barrier film, for example, films such as carbon film, e.g. amorphous carbon film, and silicon film can be exemplified.

Here, the amorphous carbon film indicates a carbon film that has an amorphous structure in an intermediate form between diamond (bond of carbon atoms is $SP^3$ bond) and graphite (bond of carbon atoms is $SP^2$ bond), and that includes hard carbon film and soft carbon film. Further, the hard carbon film also includes amorphous DLC (diamond like carbon) film mainly of $SP^3$ bond.

As a method of production of such an amorphous carbon film, for example, well-known chemical vapor deposition (CVD) represented by CVD method, thermal CVD method, plasma CVD method, and the like can be used.

Further, for example, well-known physical vapor deposition (PVD) represented by reactive sputtering method, ion plating method, arc deposition method, ion deposition method, plasma ion implantation method, and the like can be used.

In the present invention, when the CVD method is applied rather than the PVD method, the effect of the present invention will be exerted more effectively. This is because a film prepared by the CVD method contains a larger number of dangling bonds in an amorphous carbon film.

Here, for the medium gas, using hydrocarbon as the base, for example, alkanes such as methane, ethane, propane, butane, pentane, and hexane, alkenes such as ethylene, propylene, butene, pentene, and butadiene, alkynes such as acetylene, aromatic hydrocarbons such as benzene, toluene, xylene, indene, naphthalene, and phenanthrene, cycloparaffins such as cyclopropane and cyclohexane, cycloorefins such as cyclopentene and cyclohexene, and the like can be used. In addition, carbon monoxide can also be used. Owing to this, for example, it is possible to coat a container with an amorphous carbon film to prevent carbon dioxide from, for example, carbonated drinks filled in the container from permeating. Further, the amorphous carbon film may be a film having a gradient function.

When the PVD method is employed, a solid vaporizer can also be used.

Hereinafter, one example of an apparatus for film formation to form an amorphous carbon film that is provided with the inner electrode according to the present invention is explained with reference to the drawing.

FIG. 1 is a schematic diagram to represent an apparatus for film formation according to the present embodiment. As shown in FIG. 1, the apparatus for film formation according to the present example is an apparatus for film formation to carry out film formation by discharge plasma on the inner surface of a plastic container 12 having an opening 11. The apparatus for film formation is provided with an outer electrode 13 having a size large enough to enclose the outer periphery of the plastic container 12, an exhaust pipe 14 attached, via an insulating member, to an end face of the outer electrode 13 on the side where the opening 11 is arranged, an inner electrode 100-1 shown in FIG. 2 that is inserted from the exhaust pipe 14 side into the inside of the plastic container 12 in the outer electrode 13 approximately over the full longitudinal length of the plastic container 12 and is connected to the ground side as well as screwed into an insulating member 103 having a gas outlet 102 to blow-off a medium gas G, an exhauster that is not shown but attached to the exhaust pipe 14, a gas supply unit that is not shown but supplies the medium gas G to the inner electrode 100-1, and a high frequency power source 18 connected to the outer electrode 13.

Here, the outer electrode 13 is provided inside a cylindrical chamber 22 composed of chambers 22-1 (upper portion) and 22-2 (lower portion) having flanges 21a and 21b at the upper and lower ends, respectively, and the cylindrical chamber 22 is placed and held on an annular base 23. The cylindrical chamber 22 and the outer electrode 13 can be divided into two of an upper portion side and a lower portion side and are detachably attached to each other. Further, a circular insulating plate 24 is arranged between the base 23 and the bottom back face of the outer lower electrode 13-2.

Conductive connectors 41 and vacuum seals (O ring) 42 are interposed at the division portion of the cylindrical chamber 22 and the division portion of the outer electrode 13, respectively. To house the plastic container 12 inside the outer electrode 13, the division portions are moved up and down unitedly.

Further, in the present embodiment, a cylindrical spacer 25 made of a dielectric material and having a cavity portion in a shape that a circular cylinder and a truncated cone are combined corresponding to the shapes of the opening and the shoulder of the plastic container 12 inserted inside is arranged inside the outer upper electrode 13-1. The cylindrical spacer 25 is fixed with screws (not shown) screwed in from a ring-shaped insulating member 26 placed and held on the spacer 25. Owing to the insertion and fixation of the cylindrical spacer 25 to the upper portion of the outer electrode 13 in this way, when the plastic container 12 is inserted from the bottom side of the outer electrode 13, not only are the opening and the shoulder of the plastic container 12 placed in the cavity portion of the cylindrical spacer 25 but also the outer periphery of the plastic container 12 other than these portions is placed on the inner surface of the outer electrode 13.

As the dielectric material constituting the cylindrical spacer 25, for example, plastic or ceramic can be listed. Though various plastics can be used, fluororesins such as polytetrafluoroethylene that is particularly low in high frequency loss and excellent in thermal resistance are preferred. As ceramic, alumina and steatite that are low in high frequency loss, or Macor high in machinability is desired.

The exhaust pipe 14 provided with flanges 31a and 31b above and below, respectively, is placed and held on the upper surfaces of the upper flange 21a of the chamber 22 and the annular insulating member 26. A lid 32 is attached to the upper flange 31a of the exhaust pipe 14.

The high frequency power source 18 to output high frequency power is connected to the outer electrode 13 through a cable 34 and a feeder terminal 35. An impedance matching unit 36 is placed on the cable 34 between the high frequency power source 18 and the feeder terminal 35.

The inner electrode 100-1 is arranged in the plastic container 12 inserted in the outer electrode 13 and the circular spacer 25 approximately over the full length in the longitudinal direction of this container. The upper end of the inner electrode 100-1 also serves as the gas supply pipe placed on the opening 11 side of the plastic container 12. The gas supply pipe also serves as a ground terminal.

A gas hole may be opened in the lower sidewall of the inner electrode 100-1 so as to be communicated with the gas flow path 101a. In this case, it is preferred for the gas hole to be opened in the side face area in the range from the bottom portion of the inner electrode 100-1 up to 25 percent of the length inserted in the plastic container 12. The diameter of the inner electrode 100-1 is set to a diameter equal to or smaller than the mouth piece of the plastic container and the length is set to insertably long enough to approximately over the full length in the longitudinal direction of the plastic container 12.

The inner electrode 100-1 is made of, for example, a metal material having thermal resistance such as tungsten and stainless steel; however, it may be made of aluminum. Further, when the surface of the inner electrode 100-1 is smooth, a carbon film deposited on the surface of the inner electrode 100-1 is peeled off with ease. Therefore, it is preferred to make the carbon film deposited on the surface difficult to peel off by treating the surface of the inner electrode with sandblasting in advance to make the surface roughness large.

Next, with the use of the apparatus for film formation described above, a production method of a plastic container of which inner surface is coated with an amorphous carbon film is explained. The upper electrode and the chamber are divided by a pusher not shown to open the inside. Subsequently, the plastic container 12 is inserted inside the opened outer electrode 13, followed by returning the outer electrode and the chamber to the original positions by the pusher not shown, respectively. At this time, the plastic container 12 is communicated with the exhaust pipe 14 via its opening.

Next, gas inside and outside the exhaust pipe 14 and the plastic container 12, respectively, is exhausted through the exhaust pipe 14 by an exhausting unit not shown. The medium gas G is supplied to a gas flow path 101a of the inner electrode 100-1 and is allowed to be blown off into the plastic container 12 from the gas outlet 102 of this inner electrode 100-1. This medium gas G further flows toward the opening 11 of the plastic container 12. Subsequently, the balance between the gas supply volume and gas exhaust volume is stricken, and the pressure inside the plastic container 12 is set to a predetermined gas pressure.

Next, high frequency power is supplied from the high frequency power source 18 through the cable 34, the impedance matching unit 36, and the feeder terminal 35 to the outer electrode 13. At this time, discharge plasma is generated between the outer electrode 13 (essentially the inner surface of the plastic container) and the inner electrode 100-1 grounded. The medium gas G is dissociated by this discharge plasma, and film forming species generated are deposited on the inner surface of the plastic container 12 to form an amorphous carbon film.

After the film thickness of the amorphous carbon film has reached a predetermined thickness, the high frequency power supply from the high frequency power source 18 is stopped, the medium gas G supply is stopped, and the residual gas is exhausted, followed by stopping gas exhaustion. After this stopping, nitrogen, rare gas, air, or the like is supplied inside the plastic container 12 through the gas outlet 102 of the gas flow path 101a of the inner electrode 100-1 or the exhaust pipe 14, and the inside and outside pressure of this plastic container 12 is returned to an atmospheric pressure, followed by taking out the plastic container of which inner surface is coated with a carbon film. After this, the plastic container is exchanged with another plastic container in accordance with the order described above, and subsequently, a coating operation for the next plastic container is due to be carried out.

The inner electrode 100-1 according to the present embodiment is formed of the insulating member 103 screwed into the gas supply pipe 101, and therefore, it is possible to carry out film formation without falling-off of the insulating member 103 for a long time.

Second Embodiment

Next, another embodiment according to the present invention is explained. The apparatus for film formation is the same as that shown in FIG. 1, and therefore, the explanation of the apparatus for film formation is omitted in the explanation of the following embodiment.

Figure 3:
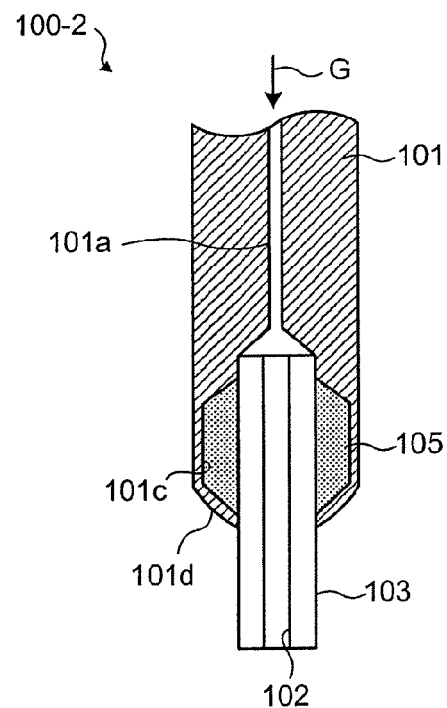
FIG. 3 is a schematic diagram of an inner electrode for barrier film formation according to a second embodiment.

A schematic inner electrode for barrier film formation according to a second embodiment of the present invention is shown in FIG. 3. As shown in FIG. 3, an inner electrode for barrier film formation 100-2 according to the present embodiment is an inner electrode for barrier film formation that is inserted into the inside of a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container, and that is provided with the gas supply pipe 101 having the gas flow path 101a to supply the medium gas G and the insulating member 103 integrally arranged inside a concave portion 101c formed in the end portion of the gas supply pipe via an adhesive 105 and having the gas outlet 102 communicated with the gas flow path 101a.

Further, falling-off of the insulating member 103 united with the adhesive 105 can be prevented by holding the adhesive 105 by means of crimping the end 101d side on a cylindrical opening side constituting the concave portion 101c.

Note that at the time of the crimping, it is intended not to form any edge portion so as to prevent local plasma concentration.

Third Embodiment

Figure 4:
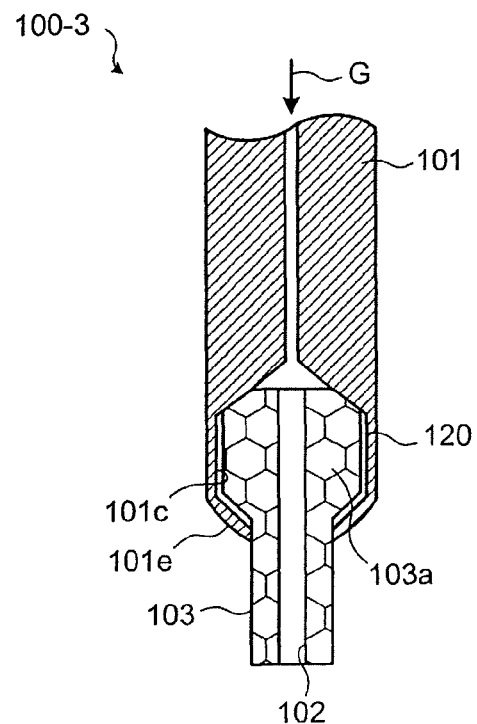
FIG. 4 is a schematic diagram of an inner electrode for barrier film formation according to a third embodiment.

A schematic inner electrode for barrier film formation according to a third embodiment of the present invention is shown in FIG. 4. As shown in FIG. 4, an inner electrode for barrier film formation 100-3 according to the present embodiment is an inner electrode for barrier film formation that is inserted into the inside of a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container, and that is provided with the gas supply pipe 101 having the gas flow path 101a to supply the medium gas G and the insulating member 103 having a bulging portion 103a fit inside the concave portion 101c formed in the end portion of the gas supply pipe 101 and having the gas outlet 102 communicated with the gas flow path 101a.

Since not only does the insulating member 103 have the bulging portion 103a but also the side of an end 101e on a cylindrical opening side constituting the concave portion 101c is crimped so as to hold the bulging portion 103a, falling-off of the insulating member 103 is prevented.

Note that at the time of the crimping, it is intended not to form any edge portion so as to prevent local plasma concentration.

Fourth Embodiment

Figure 5:
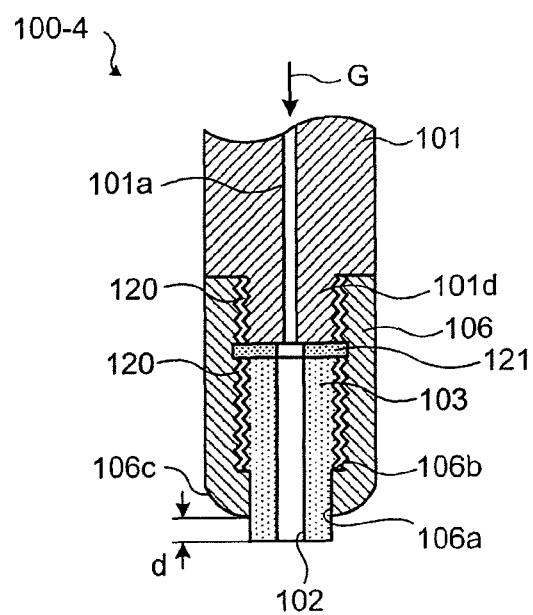
FIG. 5 is a schematic diagram of an inner electrode for barrier film formation according to a fourth embodiment.

A schematic inner electrode for barrier film formation according to a fourth embodiment of the present invention is shown in FIG. 5. As shown in FIG. 5, an inner electrode for barrier film formation 100-4 according to the present embodiment is an inner electrode for barrier film formation that is inserted into the inside of a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container, and that is provided with the gas supply pipe 101 having the gas flow path 101a to supply the medium gas G and a convex portion 101d in its end portion, a cap member 106 that is screwed onto the convex portion 101d such that their side faces become flush with each other, has an opening 106a at the center of the end face, and is hollow inside, and the insulating member 103 not only engaged with a step portion 106b of the opening of the cap member 106 but also screwed on the inner surface of the cap member 106 and having the gas outlet 102 communicated with the gas flow path 101a.

Further, an end portion 106c of the cap member 106 on the side of the gas blow-off for the medium gas G is formed in an R shape on its corner so as to prevent local plasma concentration.

A seal member 121 such as packing or gasket is interposed between the convex portion 101d and the insulating member 103 to improve its gas tightness.

The cap member 106 is made of a metal material, which makes air tightness in the joint at the portion screwed on the gas supply pipe 101 improved. Here, the metal material for the cap member 106 can include, for example, stainless steel, aluminum, tungsten, and nickel. Further, carbon materials other than metal materials may also be used.

In this case, by making use of the same material for the cap member 106 as that for the gas supply pipe 101, it is possible to retain for a long time the close attachment of the screw portion due to lessening of thermal stress by thermal expansion.

Note that a protrusion amount d of the insulating member 103 is preferably set to approximately from 1 to 10 mm and more preferably to approximately from 3 to 5 mm.

In this way, when the insulating member 103 is screwed, it is possible not only to positively prevent the insulating member 103 from falling off by retaining the insulating member 103 so as to be wrapped inside the cap member 106 with the use of the cap member 106 but also to improve the screw fitting by the use of the same metal for the cap member 106 and the gas supply pipe 101.

Fifth Embodiment

Figure 6:
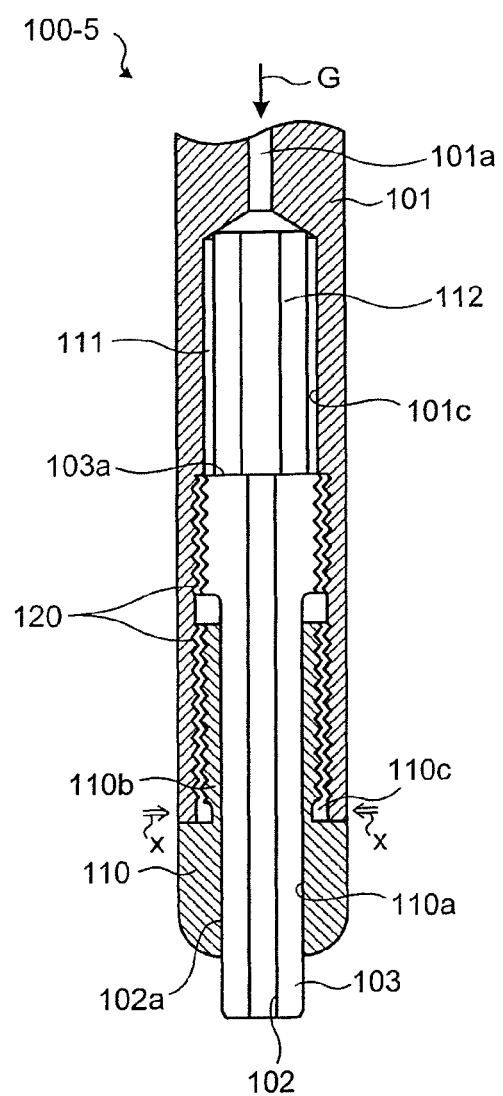
FIG. 6 is a schematic diagram of an inner electrode for barrier film formation according to a fifth embodiment.

A schematic inner electrode for barrier film formation according to a fifth embodiment of the present invention is shown in FIG. 6. As shown in FIG. 6, an inner electrode for barrier film formation 100-5 according to the present embodiment is an inner electrode for barrier film formation that is inserted into the inside of a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container, and that is provided with the gas supply pipe 101 having the gas flow path 101a to supply the medium gas G and an end portion provided with the concave portion 101c having a long space in the axial direction, the insulating member 103 whose cross section in the longitudinal direction is in an approximate T shape, screwed on the inner surface of the concave portion 101c of the gas supply pipe 101 and having the gas outlet 102 communicated with the gas flow path 101a, and a solid cap member 110 that is not only screwed, in a screw portion 110b, into the concave portion 101c such that their side faces become flush with each other but also formed with a hole 110a over the axial direction and fit with the outer periphery 102a of the gas outlet 102 of the insulating member 103.

Further, in the present embodiment, a spacer 112 is arranged inside an axial inner space portion 111 formed at the time of forming a face to be screwed on the inner surface of the concave portion 101c, which prevents a head portion 103a of the insulating member 103 in an approximate T shape from intruding toward the back of the inside of the concave portion 101c.

Furthermore, in a space 110c formed in the base end portion of the screw portion 110b, the end portion of the concave portion 101c may be crimped in the arrow X direction in the figure to further prevent the insulating member 103 from falling off.

In the present embodiment, further improvement of air tightness is aimed by increasing the area to be screwed in the seal portion 120. Owing to this, no falling-off of the insulating member 130 occurs, which makes it possible to carry out stable film formation for a long time.

Sixth Embodiment

Figure 7:
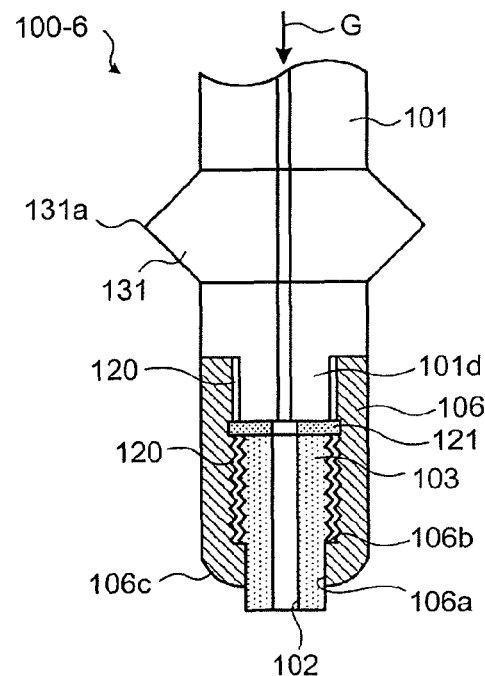
FIG. 7 is a schematic diagram of an inner electrode for barrier film formation according to a sixth embodiment.

A schematic inner electrode for barrier film formation according to a sixth embodiment of the present invention is shown in FIG. 7. As shown in FIG. 7, an inner electrode for barrier film formation 100-6 according to the present embodiment is integrally provided with a plasma generation portion 131 having at least one protruding portion 131a in the inner electrode in the inner electrode for barrier film formation 100-4 shown in the fourth embodiment.

It is preferred for the material of the plasma generation portion 131 integrally provided to be made of a material with high thermal conductivity. Here, as the materials with high thermal conductivity, for example, metal such as tungsten (W) and nickel (Ni), or carbon (C) can be exemplified.

In this way, it is possible to achieve stabilization of places where plasma is generated by plasma discharge by positively arranging the protruding portion 131a.

The number of the protruding portion 131a is not particularly limited as long as its number is equal to or more than one.

It is preferred for this plasma generation portion 131 to be arranged in a place about ten mm distant from the end portion of the insulating member 103. This is because of prevention of occurrence of chips and fractures in the insulating member due to influence of local plasma concentration when it is too close to the insulating member 103.

In addition, in the gas supply pipe 101 in FIG. 1, it is preferred for the plasma generation portion 131 to be arranged in any portion from the center to end portions of the container so as to avoid positions from the opening to the shoulder portion of the container. This is because positive generation of plasma at the opening and the shoulder portion is prevented and nonuniformity of color on the inner surface of a container is prevented.

Further, uniform film formation becomes possible by generating plasma positively in the center portion of a container.

Seventh Embodiment

Figure 8:
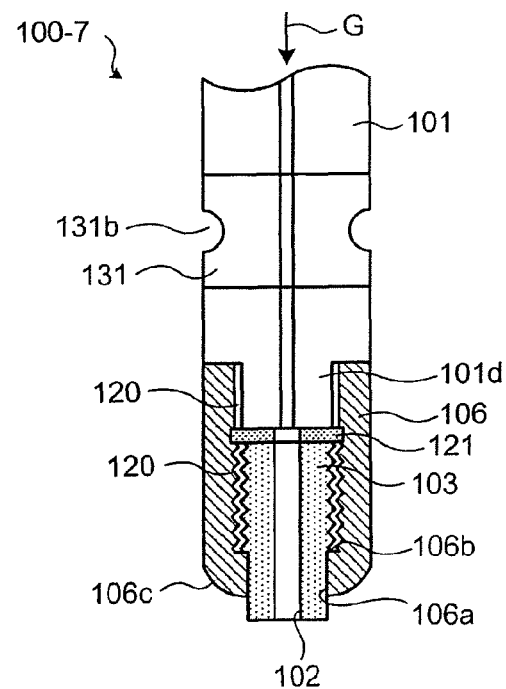
FIG. 8 is a schematic diagram of an inner electrode for barrier film formation according to a seventh embodiment.
Figure 9:
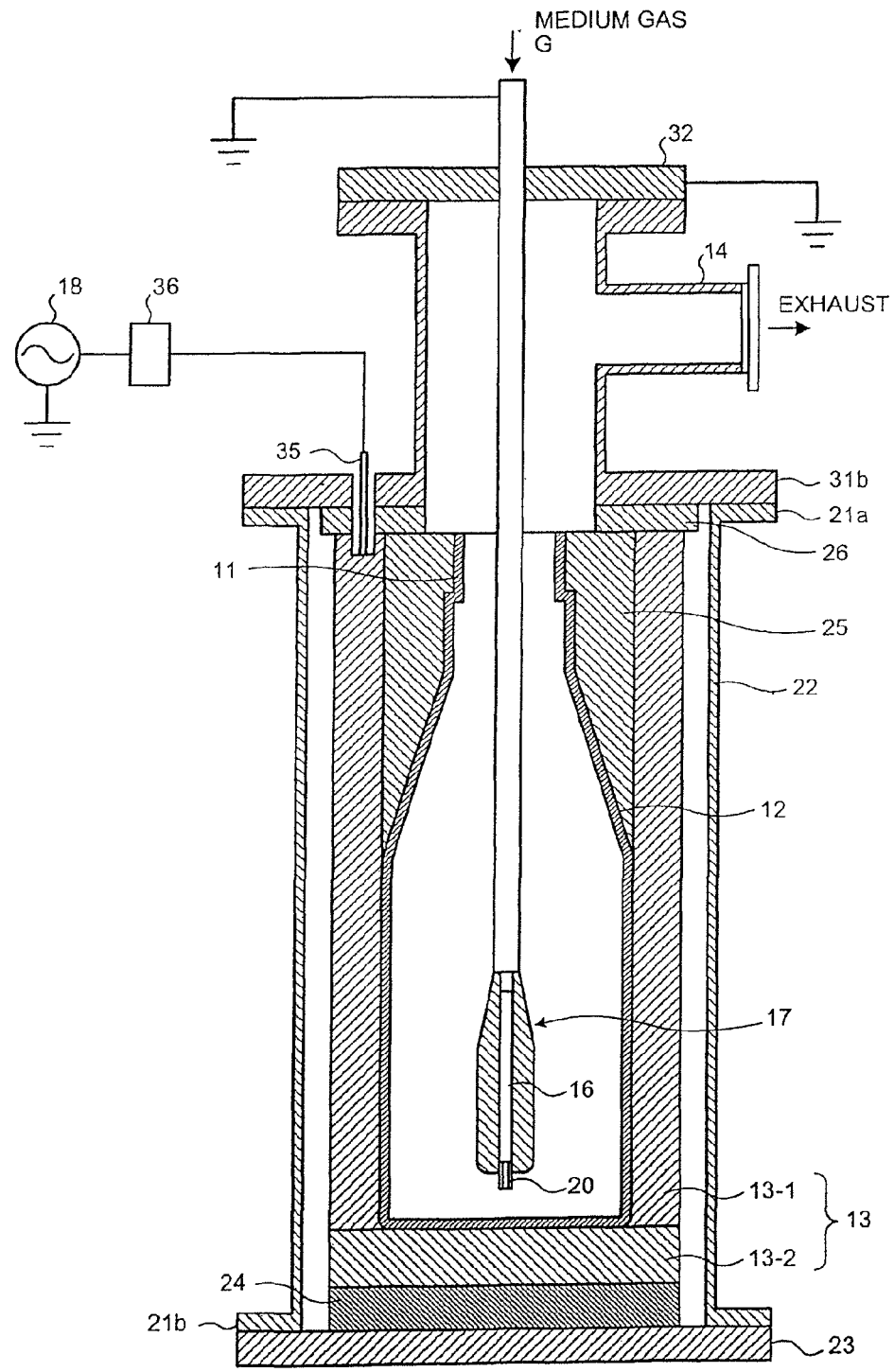
FIG. 9 is a schematic diagram of an apparatus for film formation according to conventional technology.

A schematic inner electrode for barrier film formation according to a seventh embodiment of the present invention is shown in FIG. 8.

In the sixth embodiment, the plasma generation portion 131 is provided with a protruding; however, an indentation 131b is provided in the present embodiment.

For the indentation 131b, it is possible to positively specify places where plasma is generated similarly to the protruding portion 131a, and an effect similar to that of the seventh embodiment can be obtained. The arrangement place for the indentation 131b may be the same place as that for the protruding portion 131a.

Industrial Applicability

As in the foregoing, the inner electrode for barrier film formation according to the present invention is suitable for production of container and the like excellent in a gas barrier property in which the insulating member of the inner electrode in the apparatus for film formation can be prevented from falling off and film formation of a barrier film for a container can be stably carried out at all times.

The invention claimed is:

1. An inner electrode for barrier film formation that is inserted inside a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container, the inner electrode for barrier film formation comprising:
   a gas supply pipe having a gas flow path to supply the medium gas; and
   an insulating member that includes
      a gas outlet communicated with an end portion of the gas supply pipe, and
      a falling-off preventing structure that screws into or engages with the end portion of the gas supply pipe, wherein
      the falling-off preventing structure of the insulating member includes:
         threads formed on the insulating member, the threads screwed into a threaded part of the gas supply line;
         the gas supply pipe having the gas flow path to supply the medium gas and the end portion thereof is provided with a concave portion having a long space in the axial direction; and
         a solid cap member having a gas outlet and threads on an outer surface, the threads being screwed on an inner surface of the concave portion of the gas supply pipe, the gas outlet being communicated with the gas flow path, the solid cap member being screwed, in a screw portion, into the concave portion such that the side faces become flush with each other, the solid cap member being formed with a hole over the axial direction and fitted with the outer periphery of the gas outlet of the insulating member.

2. The inner electrode for barrier film formation according to claim 1, further comprising:
   a spacer inserted in the long space pressing against the insulating member and the gas supply pipe in the axial direction.

3. The inner electrode for barrier film formation according to claim 1, further comprising:
   a seal interposed in the axial direction between the solid cap member and a widened portion of the insulating member.

4. The inner electrode for barrier film formation according to claim 1, further comprising:
   a spacer inserted in the long space pressing against the insulating member and the gas supply pipe in the axial direction; and
   a seal interposed in the axial direction between the solid cap member and a widened portion of the insulating member.

5. An inner electrode for barrier film formation that is inserted inside a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container, the inner electrode for barrier film formation comprising:
   a gas supply pipe having a gas flow path to supply the medium gas; and
   an insulating member that includes
      a gas outlet communicated with an end portion of the gas supply pipe, and
      a falling-off preventing structure that screws into or engages with the end portion of the gas supply pipe, wherein
      the falling-off preventing structure of the insulating member includes:
         the gas supply pipe having the gas flow path to supply the medium gas and the end portion thereof is provided with a concave portion having a long space in the axial direction;
         a spacer inserted in the long space pressing against the insulating member and the gas supply pipe in the axial direction;
         a solid cap member having a gas outlet that is screwed on an inner surface of the concave portion of the gas supply pipe and communicated with the gas flow path, the solid cap member being screwed, in a screw portion, into the concave portion such that the side faces become flush with each other, the solid cap member being formed with a hole over the axial direction and fitted with the outer periphery of the gas outlet of the insulating member; and
         a plasma generation portion having at least one protruding portion or indentation on the gas supply pipe, the plasma generation portion being integrally provided with the gas supply pipe.

6. The inner electrode for barrier film formation according to claim 5, wherein the falling-off preventing structure of the insulating member includes:
   threads formed on the insulating member, the threads screwed into a threaded part of the gas supply line.

7. The inner electrode for barrier film formation according to claim 5, further comprising:
   a seal interposed in the axial direction between the solid cap member and a widened portion of the insulating member.

8. The inner electrode for barrier film formation according to claim 5, further comprising:
   a seal interposed in the axial direction between the solid cap member and a widened portion of the insulating member, wherein
   the falling-off preventing structure of the insulating member includes threads formed on the insulating member, the threads screwed into a threaded part of the gas supply line.

9. An inner electrode for barrier film formation that is inserted inside a plastic container having an opening, supplies a medium gas to the inside of the plastic container, and supplies high frequency power to an outer electrode arranged outside the plastic container, thereby generating discharge plasma on the inner surface of the plastic container to form a barrier film on the inner surface of the plastic container, the inner electrode for barrier film formation comprising:

a gas supply pipe having a gas flow path to supply the medium gas; and an insulating member that includes
- a gas outlet communicated with an end portion of the gas supply pipe, and
- a falling-off preventing structure that screws into or engages with the end portion of the gas supply pipe, wherein the falling-off preventing structure of the insulating member includes:
- the gas supply pipe having the gas flow path to supply the medium gas and the end portion thereof is provided with a concave portion having a long space in the axial direction;
- a solid cap member having a gas outlet that is screwed on an inner surface of the concave portion of the gas supply pipe and communicated with the gas flow path, the solid cap member being screwed, in a screw portion, into the concave portion such that the side faces become flush with each other, the solid cap member being formed with a hole over the axial direction and fitted with the outer periphery of the gas outlet of the insulating member;
- a seal interposed in the axial direction between the solid cap member and a widened portion of the insulating member; and
- a plasma generation portion having at least one protruding portion or indentation on the gas supply pipe, the plasma generation portion being integrally provided with the gas supply pipe, the plasma generation portion being made of a material with high thermal conductivity.

10. The inner electrode for barrier film formation according to claim 9, further comprising:
- a spacer inserted in the long space pressing against the insulating member and the gas supply pipe in the axial direction.

11. The inner electrode for barrier film formation according to claim 9, wherein the falling-off preventing structure of the insulating member includes:
- threads formed on the insulating member, the threads screwed into a threaded part of the gas supply line.

12. The inner electrode for barrier film formation according to claim 9, further comprising:
- a spacer inserted in the long space pressing against the insulating member and the gas supply pipe in the axial direction, wherein
- the falling-off preventing structure of the insulating member includes threads formed on the insulating member, the threads screwed into a threaded part of the gas supply line.

* * * * *